US009759743B2

(12) United States Patent
Ku et al.

(10) Patent No.: US 9,759,743 B2
(45) Date of Patent: Sep. 12, 2017

(54) TESTING SYSTEM AND METHOD FOR TESTING OF ELECTRICAL CONNECTIONS

(71) Applicant: MPI CORPORATION, Zhubei (TW)

(72) Inventors: Wei-Cheng Ku, Zhubei (TW); Shao-Wei Lu, Zhubei (TW); Hao Wei, Zhubei (TW); Yu-Tse Wang, Zhubei (TW)

(73) Assignee: MPI CORPORATION, Zhubei (TW)

( * ) Notice: Subject to any disclaimer, the term of this patent is extended or adjusted under 35 U.S.C. 154(b) by 169 days.

(21) Appl. No.: 14/552,957

(22) Filed: Nov. 25, 2014

(65) Prior Publication Data

US 2015/0233969 A1 Aug. 20, 2015

(30) Foreign Application Priority Data

Dec. 13, 2013 (TW) ............................ 102146122 A

(51) Int. Cl.

| | |
|---|---|
| ***G01R 31/00*** | (2006.01) |
| ***G01R 1/073*** | (2006.01) |
| ***G01R 1/02*** | (2006.01) |
| ***G01R 1/04*** | (2006.01) |
| ***G01R 31/28*** | (2006.01) |
| *G01R 35/00* | (2006.01) |

(52) U.S. Cl.

CPC ......... *G01R 1/07314* (2013.01); *G01R 1/025* (2013.01); *G01R 1/04* (2013.01); *G01R 1/07392* (2013.01); *G01R 31/2812* (2013.01); *G01R 35/005* (2013.01)

(58) Field of Classification Search

CPC G01R 31/26; G01R 31/2642; G01R 31/2648; G01R 31/2831; G01R 31/31702

See application file for complete search history.

(56) References Cited

U.S. PATENT DOCUMENTS 3,848,188 A * 11/1974 Ardezzone ............ G01R 1/073 340/870.13
2016/0077147 A1* 3/2016 Wang .................... G01R 31/26 324/754.1

FOREIGN PATENT DOCUMENTS

CN 101458303 6/2009
TW 200916789 4/2009

(Continued)

OTHER PUBLICATIONS

Examination Report for CN100089 issued on Jan. 26, 2017, total of 9 pages.
Abstract for CN101458303, total of 1 page.

*Primary Examiner* — Tung X Nguyen

(74) *Attorney, Agent, or Firm* — Tracy M. Heims; Apex Juris, pllc.

(57) ABSTRACT

A testing system includes a test machine, a plurality of probe sets, a data input device, a controller, a memory, and a data output device. The test machine has a platform for a DUT to be placed thereon, and a test arm which is movable relative to the platform. The probe sets are provided on the test machine with at least one probe set provided on the test arm to contact the DUT. The data input device is used to input information about the DUT. The controller is electrically connected to the test arm, the probe set on the test arm, and the data input device to move the test arm to a predetermined position according to the inputted information, and to make the probe set contact the DUT for electrical test. The memory saves electrical test result, which is outputted by the data output device.

19 Claims, 7 Drawing Sheets

60
50
40
10
Data Output Device
Memory
Controller
14
Test Arm
30
Probe Set
Probe Set
Probe Set
Probe Set
20
20
20
20
100
Data Input Device

(56) References Cited

FOREIGN PATENT DOCUMENTS

| | | |
|---|---|---|
| TW | 201202713 | 1/2012 |
| TW | 201348723 | 12/2013 |

* cited by examiner

TESTING SYSTEM AND METHOD FOR TESTING OF ELECTRICAL CONNECTIONS

BACKGROUND OF THE INVENTION

1. Technical Field

The present invention relates generally to electrical test, and more particularly to a testing system and a method for testing of electrical connections.

2. Description of Related Art

For a manufacturer of electronic products, a testing system capable of checking electrical connections between each precision electronic component is usually required in different steps of the manufacturing process, which helps to ensure the quality of products.

However, a conventional electrical test system can only test products with one single testing specification at once, and has no capacity to handle tasks of multiple testing specifications. In addition, to test products with different specifications, it has to manually disassemble and replace corresponding probe sets, which is time-consuming and laborious.

BRIEF SUMMARY OF THE INVENTION

In view of the above, the primary objective of the present invention is to provide a testing system and a method for testing of electrical connections, which is able to do electrical test on objects with different specifications.

The present invention provides a testing system to do an electrical test on a circuit, wherein the testing system includes a test machine, a plurality of probe sets, a data input device, a controller, a memory, and a data output device. The test machine has a platform and a test arm, wherein the platform is for a DUT which has the circuit to be placed thereon; the test arm is movable relative to the platform. The probe sets are provided on the test machine, wherein each of the probe set has at least two probes; at least one of the probe sets are provided on the test arm to be moved along with the test arm to contact a tested portion of the circuit. The data input device is used to input information of the tested portion of the circuit. The controller is provided on the test machine, and is electrically connected to the test arm, at least one of the probe sets on the test arm, and the data input device, wherein the controller moves the test arm to a predetermined position according to the information inputted through the data input device, and makes at least one of the probe sets on the test arm contact the tested portion of the circuit to do the electrical test. The memory is electrically connected to the controller to save an electrical test result obtained after the probe set on the test arm contacts the tested portion of the circuit. The data output device is electrically connected to the memory to output the electrical test result.

The present invention further provides a method for testing of electrical connections with the testing system, wherein the method is used to do an electrical test on a circuit, and includes the following steps: (a) engage a DUT which has the circuit on the platform; (b) obtain information of the tested portion of the circuit with the data input device; (c) calibrate the test machine and the at least one probe set on the test arm; (d) move the test arm to a predetermined position by the controller according to the information inputted through the data input device, and making the at least two probes of the corresponding probe set contact the tested portion of the circuit to do the electrical test; (e) save an electrical test result obtained in step (d) into the memory; (f) output the electrical test result saved in the memory with the data output device; and (g) disengage the DUT and the platform.

Whereby, with the aforementioned design, the testing system can be used in testing tasks for different specifications.

BRIEF DESCRIPTION OF THE SEVERAL VIEWS OF THE DRAWINGS

The present invention will be best understood by referring to the following detailed description of some illustrative embodiments in conjunction with the accompanying drawings, in which.

DETAILED DESCRIPTION OF THE INVENTION

Figure 1:
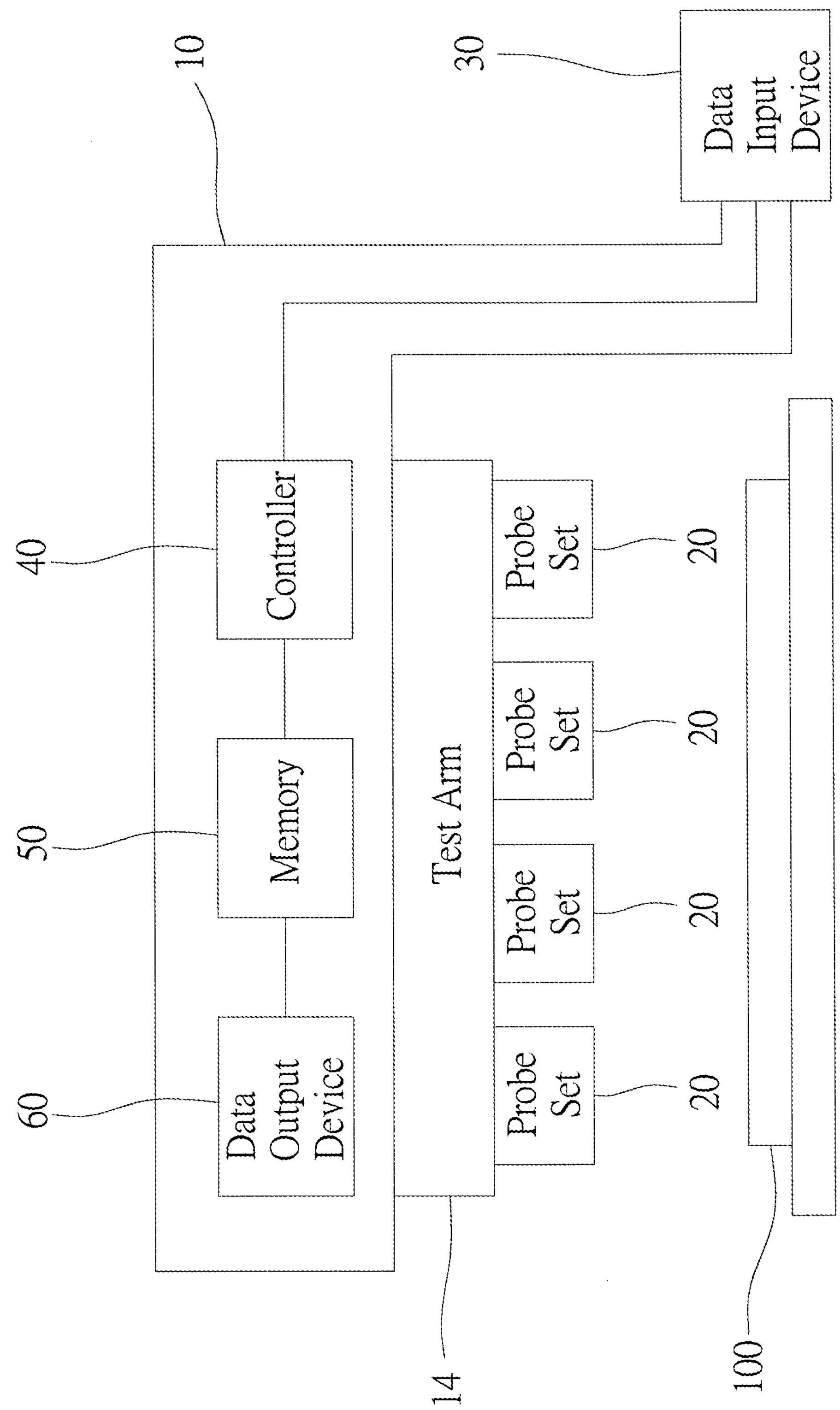
FIG. 1 is a schematic diagram of the testing system of a first preferred embodiment of the present invention.

As shown in FIG. 1, a testing system of the first preferred embodiment of the present invention, which is used to do electrical test on a circuit, includes a test machine 10, a plurality of probe sets 20, a data input device 30, a controller 40, a memory 50, and a data output device 60.

Figure 2:
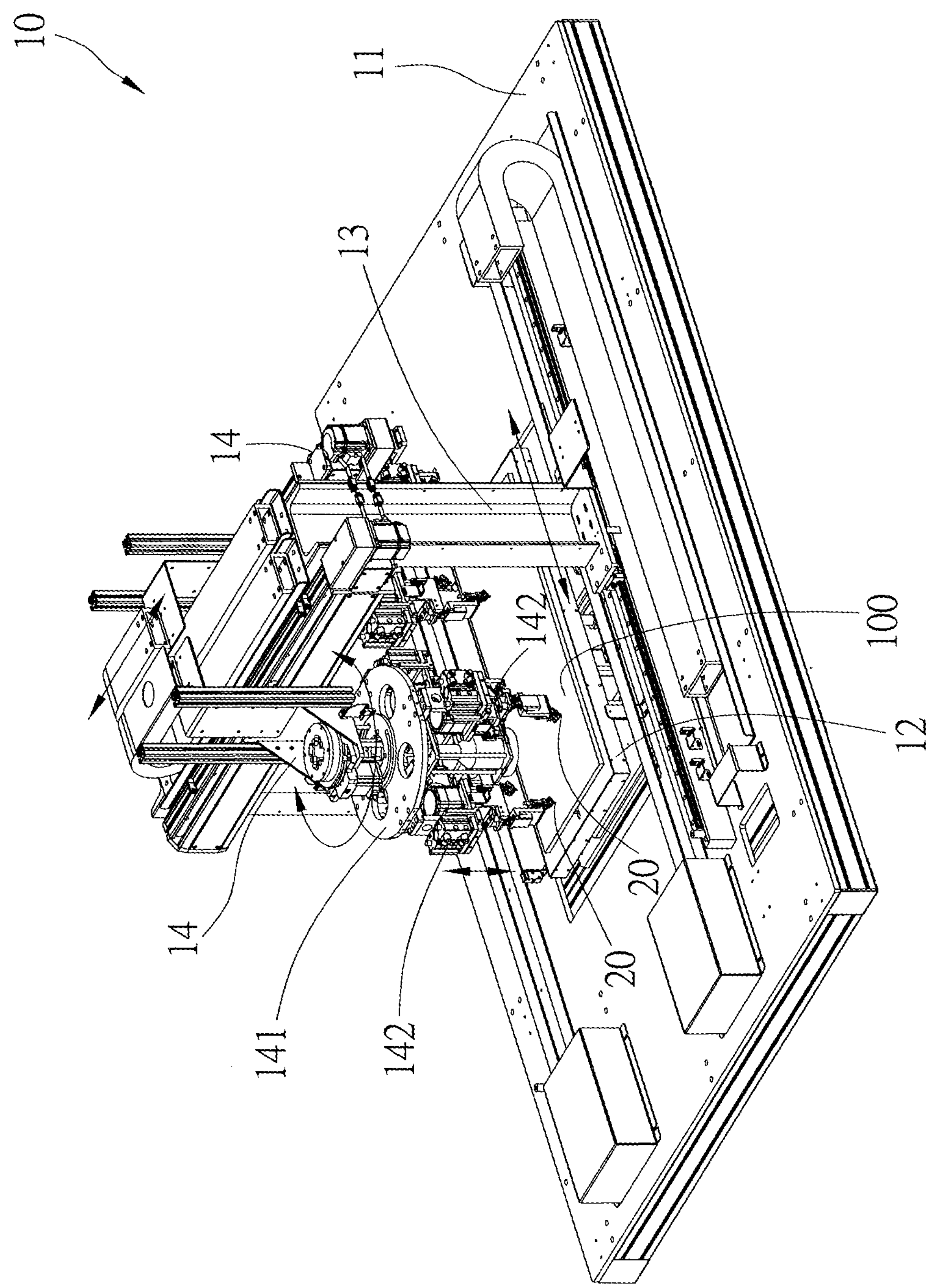
FIG. 2 is a perspective view of the test machine of the first preferred embodiment of the present invention.

As shown in FIG. 2, the test machine 10 includes a base 11, a platform 12, a support 13, and two test arms 14. The platform 12 is provided on the base 11 for a DUT (device under test), which has the circuit, to be placed thereon, and the platform 12 is movable relative to the base 11. The support 13 is provided on the base 11 above the platform 12, and is movable relative to the base 11 and the platform 12. The test arms 14 are respectively provided at opposite sides of the support 13, and are both drivable by the support 13 to move relative to the base 11 and the platform 12. Furthermore, the test arms 14 can also be driven to move relative to the support 13. In the first preferred embodiment of the present invention, each of the test arms 14 includes a rotary table 141 and a plurality of receiving seats 142, wherein the rotary table 141 can be driven to move and rotate relative to the platform 12; the receiving seats 142 are provided on the rotary table 141, and are drivable to rotate or move vertically relative to the rotary table 141.

Figure 3:
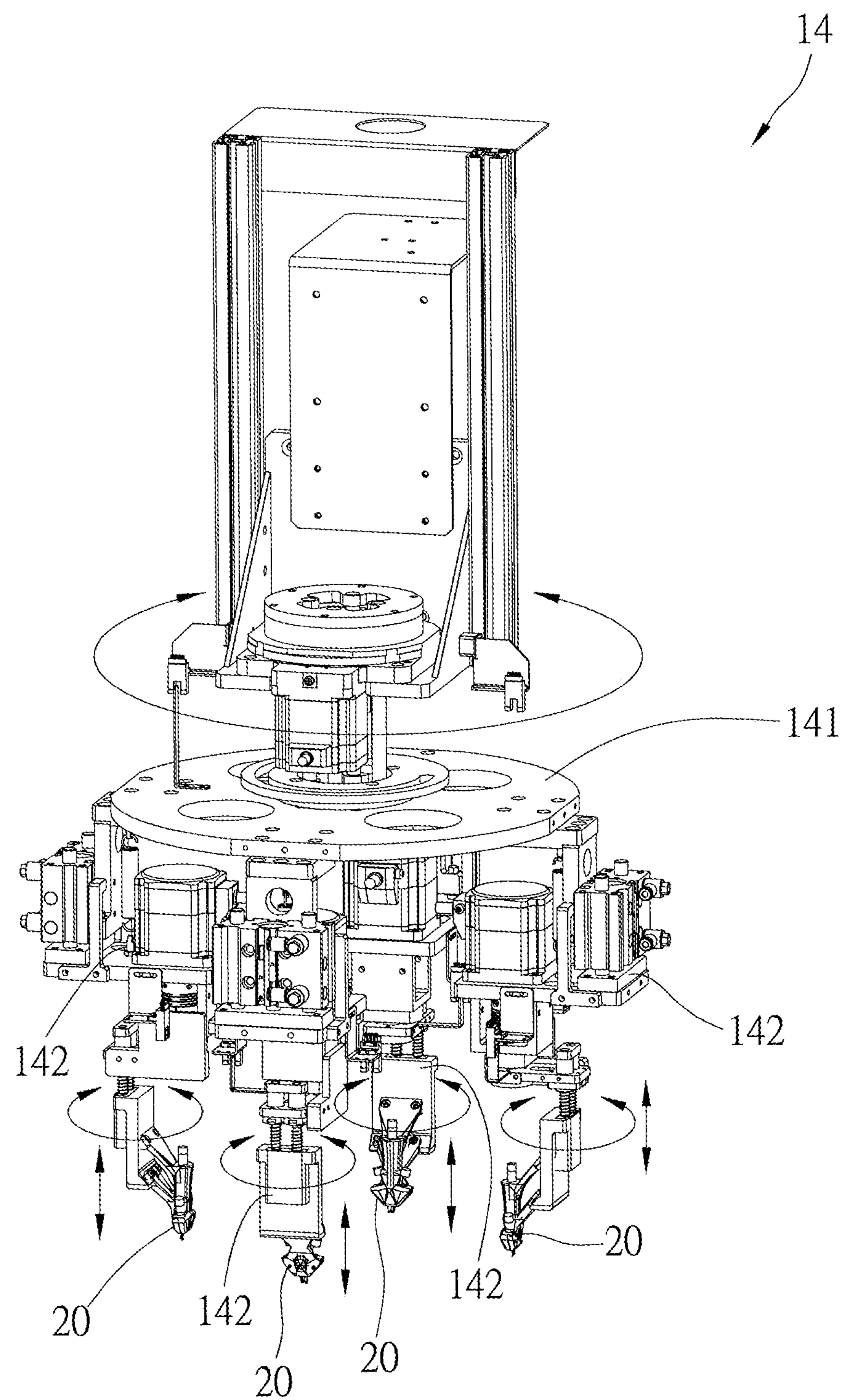
FIG. 3 is a perspective view of the test arm of the first preferred embodiment of the present invention.
Figure 4:
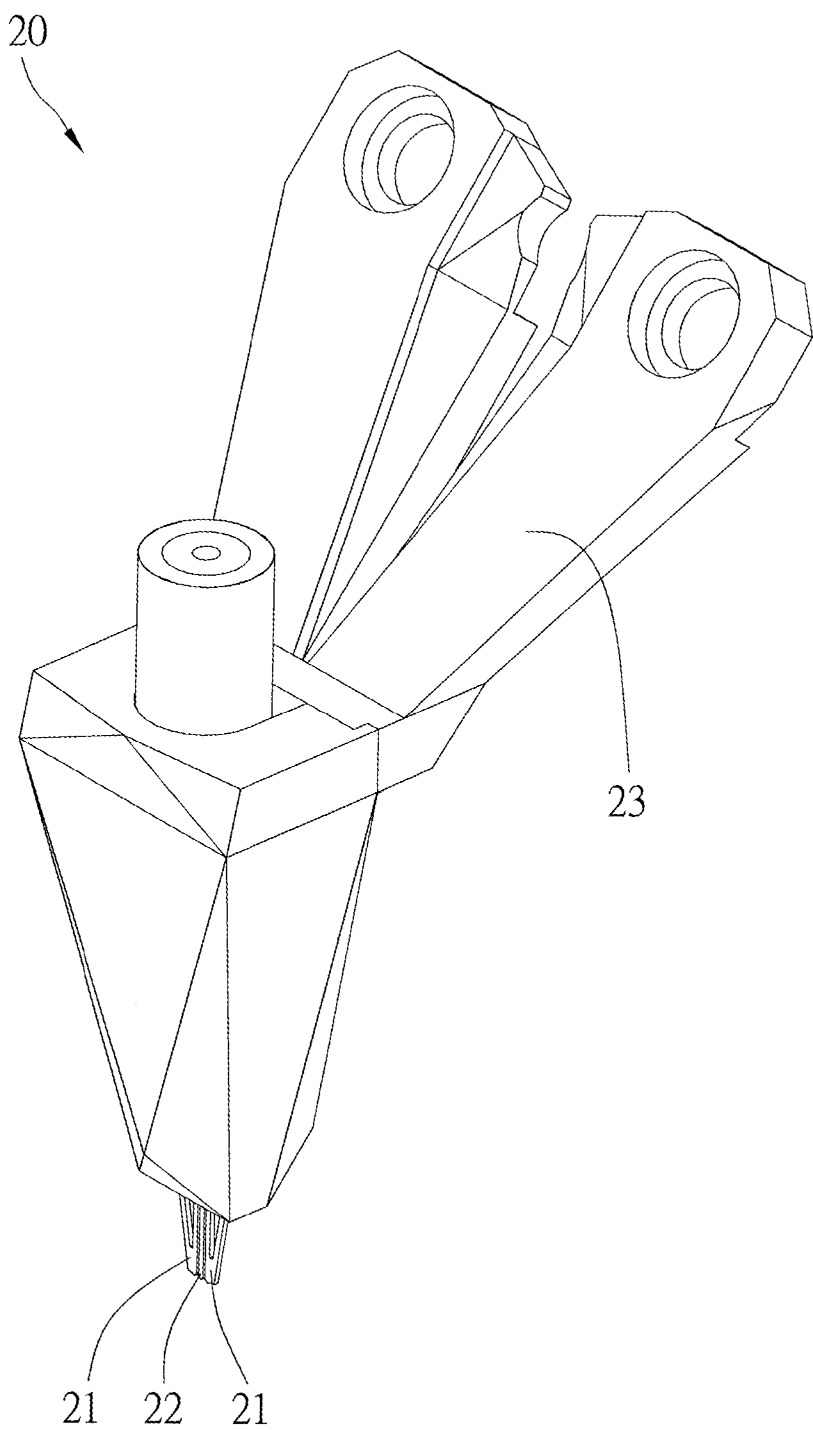
FIG. 4 is a perspective view of the probe set of the first preferred embodiment of the present invention.

As shown in FIG. 3, the probe sets 20 are respectively fixed on the receiving seats 141 on the test arms 14 to contact a tested portion of the circuit, and therefore can be moved along with the test arms 14. As shown in FIG. 4, each of the probe sets 20 has a case 23 and three probes 21, 22 extending out of the case 23. In more details, the probes 21, 22 includes two ground probes 21 and a signal probe 22, wherein the signal probe 22 is located between the ground probes 21. It is worth mentioning that, a distance between the signal probe 22 and each of the ground probes 21 for each of the probe sets 20 is different from each other, and therefore the testing system provided in the present invention has wider compatibility.

The data input device 30 is used to input layout information of the tested portion of the circuit. In the first preferred embodiment of the present invention, the data input device 30 is a file reader which reads inputted electronic information about layout of the circuit, and information such as location and measuring distance of the tested portion can be obtained in this way. In other embodiments, the data input device 30 can be an optical lens which captures a layout image of the tested portion of the circuit for obtaining related information, or other controls such as mouse, joystick, keyboard, etc., which can be used to move the test arm to a certain position suitable for obtaining related information of the tested portion of the circuit.

The controller 40 is provided on the test machine 10, and is electrically connected to the test arm 14, the probe sets 20 on the test arm 14, and the data input device 30, wherein the controller 40 is used to move the test arm 14 to a predetermined position according to the information inputted through the data input device 30, and to make one of the probe sets 20 on the test arm 14 contact the tested portion of the circuit.

The memory 50 is electrically connected to the controller 40 to save electrical test results received after the probe set 20 on the test arm 14 contacts the tested portion of the circuit.

The data output device 60 is electrically connected to the memory 50 to output the electrical test results. In the first preferred embodiment of the present invention, the data output device 60 is a wireless signal transmitter, which wirelessly transmits the electrical test results to phones or computers to allow a user to monitor the results remotely. Of course, in other embodiments, the data output device 60 can be a printer which prints out the electrical test results, or a screen which displays the electrical test results thereon.

Figure 5:
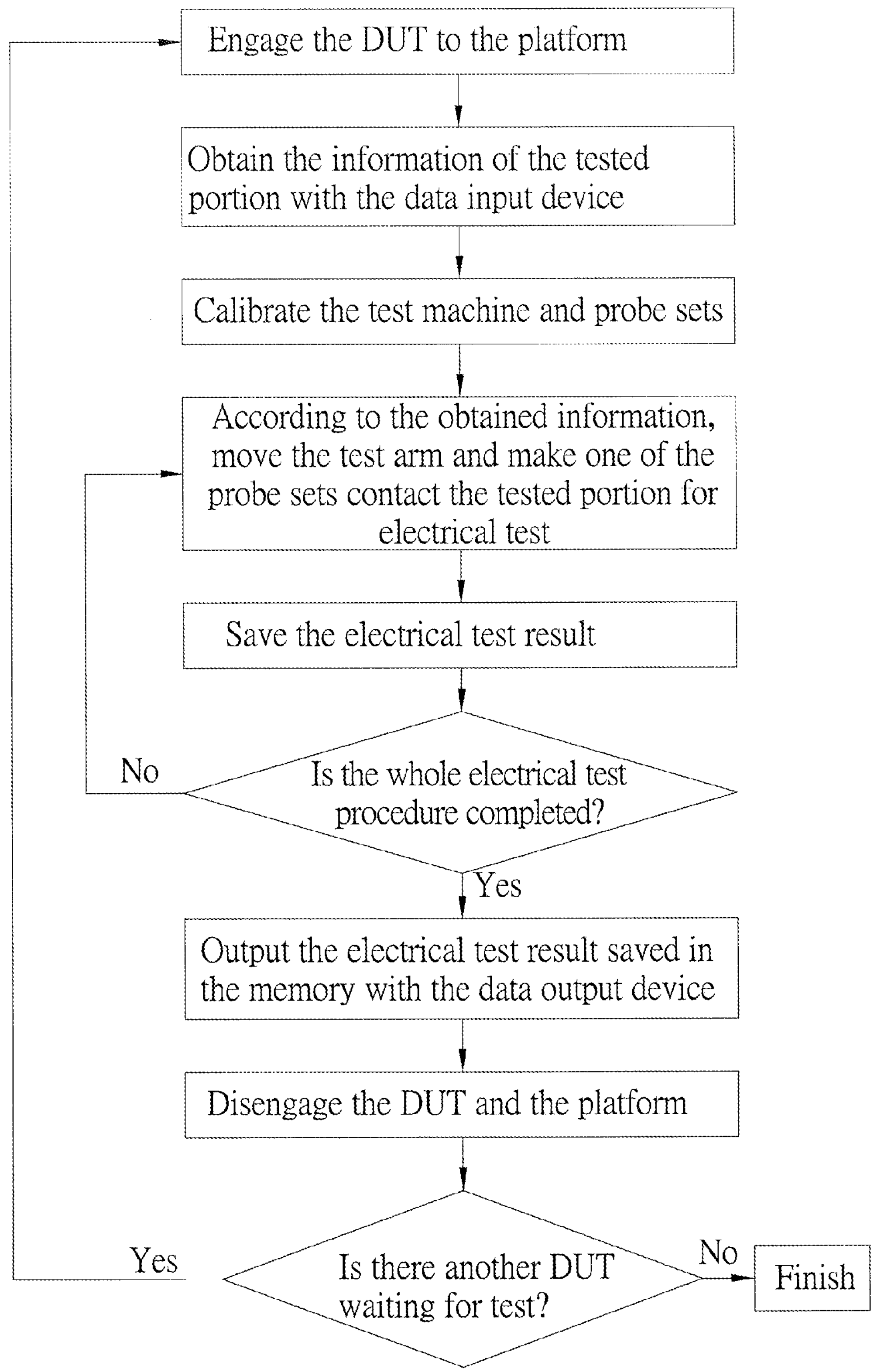
FIG. 5 is a flow chart of the method for testing of electrical connections of the first preferred embodiment of the present invention.

As shown in FIG. 5, electrical tests for objects with different specifications can be done with the aforementioned design by following the steps below:

(a) Engage a DUT 100 which has the circuit to the platform 12.

(b) Obtain information of the tested portion of the circuit with the data input device 30. As mentioned above, by reading the inputted information about the layout of the circuit, by capturing the layout image of the circuit of the DUT 100, or by moving the test arm 14 to an appropriate position, the information of the tested portion of the circuit is obtained.

(c) According to the information obtained in step (b), make one of more probe sets 20 on the test arm 14 contact a calibration plate (not shown) for short-circuit test, open-circuit test, and impedance test, and then compensate and calibrate the testing system based on the result of these tests.

(d) Move the test arm 14 by the controller 40 to a predetermined position according to the obtained information, and make the probe set 20 which corresponds to the tested portion of the circuit contact the tested portion to do electrical test.

(e) Save the electrical test result into the memory 50.

If the whole electrical test procedure is not completed yet, repeat step (d) and E until all tested portions are tested.

(f) Output the electrical test result with the data output device 60. As mentioned above, the electrical test result can be outputted by being transmitted wirelessly to phones or computers, by being printed out, or by being displayed on a screen.

(g) Disengage the DUT 100 and the platform.

To test another DUT 100, simply go through step (a) to step (g).

In summary, with the aforementioned testing system and the method for testing of electrical connections, the testing system is capable of doing electrical tests of different specifications, which allows a tester to do electrical tests in a quicker and more convenient way.

Figure 6:
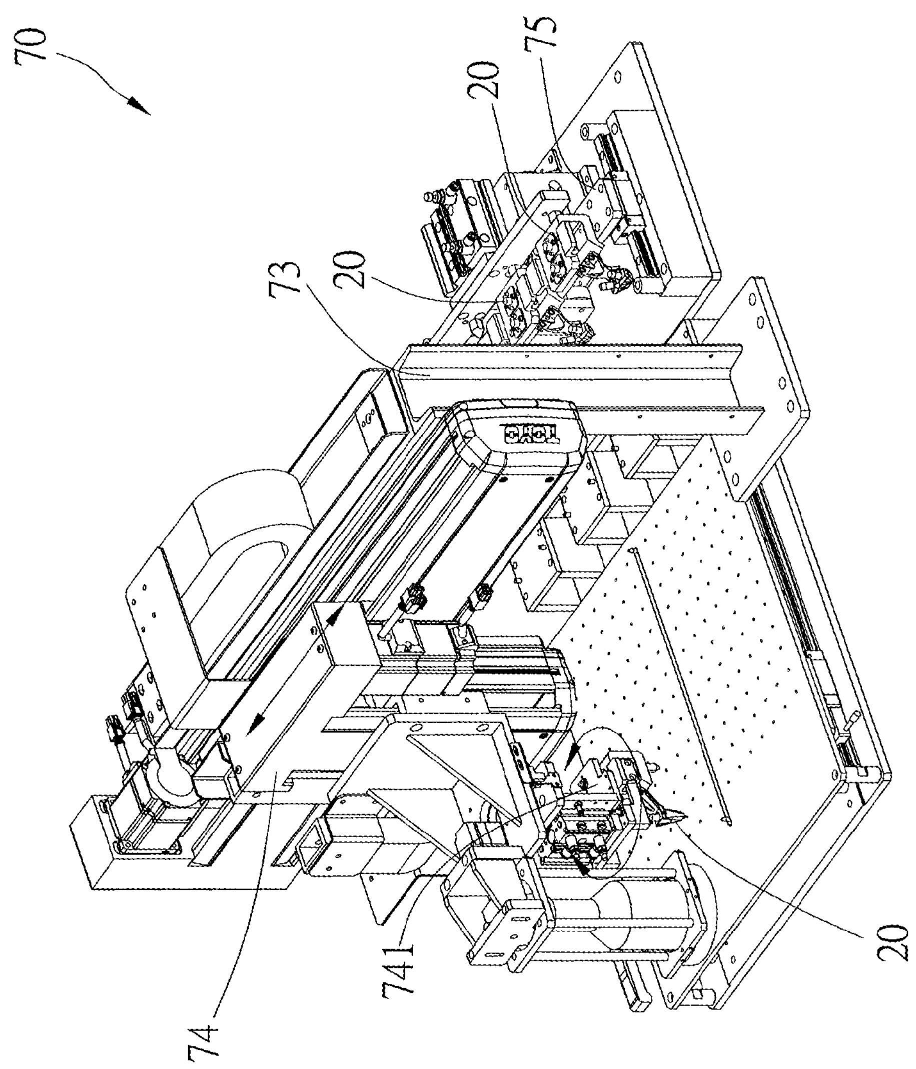
FIG. 6 is a perspective view of the test machine of a second preferred embodiment of the present invention.
Figure 7:
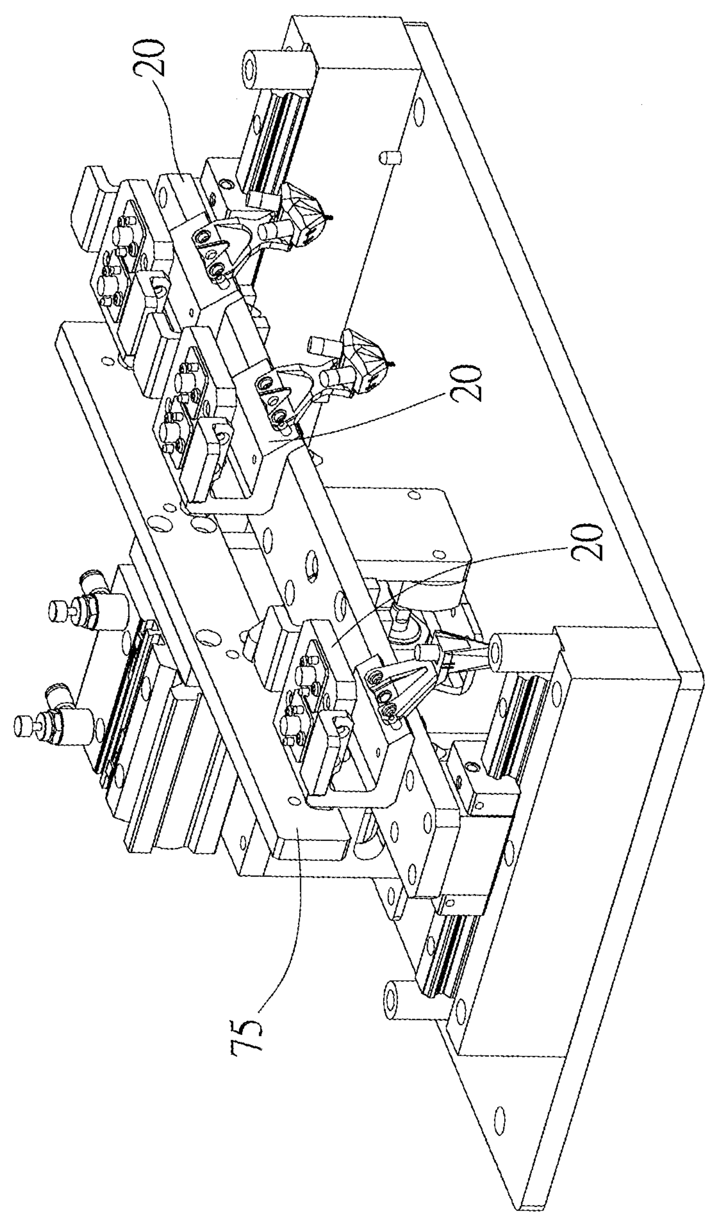
FIG. 7 is a perspective view of the probe set of the second preferred embodiment of the present invention.

In addition, as shown in FIG. 6, a test machine 70 of the testing system of the second preferred embodiment is basically the same with the test machine 10 of the first preferred embodiment, except that its test arm 74 has a holder 741. The test arm 74 can be moved along with a support 73, and is also movable and rotatable relative to the support 73. There is only one probe set 20 provided on the holder 741 of the test arm 74, while other unused probe sets 20 are provided on a probe frame 75 on the test machine as shown in FIG. 7. The probe sets 20 can be repeatedly engaged and disengaged with the holder 741. With the test machine 70 of the second preferred embodiment, the probe set 20 suitable for the current measuring distance is selected and engaged to the holder 741 of the test arm 14 in the aforementioned step (c). After the selected probe set 20 is engaged to the holder 741 of the test arm 14, calibration for the test machine 70 and the probe set 20 is then performed to continue the following steps of the method for testing of electrical connections. In this way, the testing system is still capable of doing electrical tests of different specifications, which also allows a tester to do electrical tests in a quicker and more convenient way.

It must be pointed out that the embodiments described above are only some preferred embodiments of the present invention. All equivalent structures and methods which employ the concepts disclosed in this specification and the appended claims should fall within the scope of the present invention.

What is claimed is:

1. A testing system, which is used to do an electrical test on a circuit, comprising:

- a test machine having a platform and a test arm, wherein the platform is for a DUT which has the circuit to be placed thereon; the test arm is movable relative to the platform;
- a plurality of probe sets provided on the test machine, wherein each of the probe set has at least two probes; at least one of the probe sets are provided on the test arm to be moved along with the test arm to contact a tested portion of the circuit;
- a data input device for inputting information of the tested portion of the circuit;
- a controller provided on the test machine, and electrically connected to the test arm, at least one of the probe sets on the test arm, and the data input device, wherein the controller moves the test arm to a predetermined position according to the information inputted through the data input device, and makes at least one of the probe sets on the test arm contact the tested portion of the circuit to do the electrical test;
- a memory electrically connected to the controller to save an electrical test result obtained after the probe set on the test arm contacts the tested portion of the circuit; and
- a data output device electrically connected to the memory to output the electrical test result.

2. The testing system of claim 1, each of the probe sets has at least two probes; a distance between the probes of each of the probe sets is different from each other.

3. The testing system of claim 1, wherein the probe sets are all provided on the test arm.

4. The testing system of claim 1, wherein data input device is a file reader, which reads inputted electronic information about layout of the circuit.

5. The testing system of claim 1, wherein data input device is an optical lens, which captures a layout image of the circuit on the DUT to obtain the information of the tested portion of the circuit.

6. The testing system of claim 1, wherein data input device is a mouse, a joystick, or a keyboard, which drives the controller to move the test arm to a position suitable for obtaining the information of the tested portion of the circuit.

7. The testing system of claim 1, wherein data output device is a wireless signal transmitter, which wirelessly transmits the electrical test result to phones or computers.

8. The testing system of claim 1, wherein data output device is a printer, which prints out the electrical test result.

9. The testing system of claim 1, wherein data output device is a screen, which displays the electrical test result thereon.

10. A method for testing of electrical connections using the testing system of claim 1, to do an electrical test on a circuit, comprising the steps of:

(a) engaging a DUT which has the circuit on the platform;

(b) obtaining information of the tested portion of the circuit with the data input device;

(c) calibrating the test machine and the at least one probe set on the test arm;

(d) moving the test arm to a predetermined positon by the controller according to the information inputted through the data input device, and making the at least two probes of the corresponding probe set contact the tested portion of the circuit to do the electrical test;

(e) saving an electrical test result obtained in step (d) into the memory;

(f) outputting the electrical test result saved in the memory with the data output device; and (g) disengaging the DUT and the platform.

11. The method of claim 10, wherein the information of the tested portion of the circuit is obtained by reading inputted electrical information of layout of the circuit.

12. The method of claim 10, wherein the information of the tested portion of the circuit is obtained by capturing a layout image of the circuit of the DUT.

13. The method of claim 10, wherein the information of the tested portion of the circuit is obtained by moving the test arm to a positon suitable for obtaining the information.

14. The method of claim 10, wherein the at least one probe set corresponds to the tested portion of the circuit is selected and engaged on the test arm before calibrating the test machine and the at least one probe set on the test arm.

15. The method of claim 10, wherein the test machine and the at least one probe set on the test arm is calibrated by making the at least one probe set on the test arm contact a calibration plate for at least one test among short-circuit test, open-circuit test, and impedance test; compensation for the test machine and the at least one probe set on the test arm is done according to result of the tests.

16. The method of claim 10, wherein the electrical test result is outputted by being wirelessly transmitted to phones or computers.

17. The method of claim 10, wherein the electrical test result is outputted by being printed out.

18. The method of claim 10, wherein the electrical test result is outputted by being displayed on a screen.

19. The method of claim 10, wherein step (d) and step (e) are repeated multiple times before taking step (f).

* * * * *